(12) United States Patent
Kuang et al.

(10) Patent No.: US 12,199,034 B2
(45) Date of Patent: Jan. 14, 2025

(54) VIA RAIL STRUCTURE

(71) Applicant: Taiwan Semiconductor Manufacturing Co., Ltd., Hsin-Chu (TW)

(72) Inventors: Hao Kuang, Hsinchu (TW); Tung-Heng Hsieh, Hsinchu County (TW); Sheng-Hsiung Wang, Hsinchu County (TW); Bao-Ru Young, Hsinchu County (TW); Wang-Jung Hsueh, New Taipei (TW); Pang-Chi Wu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/454,209

(22) Filed: Aug. 23, 2023

(65) Prior Publication Data
US 2023/0411280 A1    Dec. 21, 2023

Related U.S. Application Data

(62) Division of application No. 16/943,591, filed on Jul. 30, 2020, now abandoned.

(60) Provisional application No. 62/908,372, filed on Sep. 30, 2019.

(51) Int. Cl.
| | | |
|---|---|---|
| *H01L 23/522* | (2006.01) | |
| *G06F 30/392* | (2020.01) | |
| *G06F 30/3953* | (2020.01) | |
| *G06F 30/398* | (2020.01) | |

(52) U.S. Cl.
CPC ........ *H01L 23/5226* (2013.01); *G06F 30/392* (2020.01); *G06F 30/3953* (2020.01); *G06F 30/398* (2020.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |

(Continued)

*Primary Examiner* — Hrayr A Sayadian
(74) *Attorney, Agent, or Firm* — HAYNES AND BOONE, LLP

(57) ABSTRACT

A device includes a semiconductor substrate, an active region over the semiconductor substrate extending lengthwise in a first direction, a gate structure over the active region extending lengthwise in a second direction perpendicular to the first direction, a source feature and a drain feature on the active region and interposed by the gate structure, a source contact on the source feature, a drain contact on the drain feature, and a via rail over the substrate spaced from the active region. The via rail includes a main portion extending lengthwise in the first direction having a sidewall surface facing opposite the end surface of the drain contact, and a jog via extending from the main portion along the second direction and having a sidewall surface facing the second direction, each of the main portion and the jog via contacting the source contact.

20 Claims, 8 Drawing Sheets

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2012/0286341 A1 | 11/2012 | Chen et al. |
| 2018/0301447 A1* | 10/2018 | Zhu .................... H01L 27/0207 |

* cited by examiner

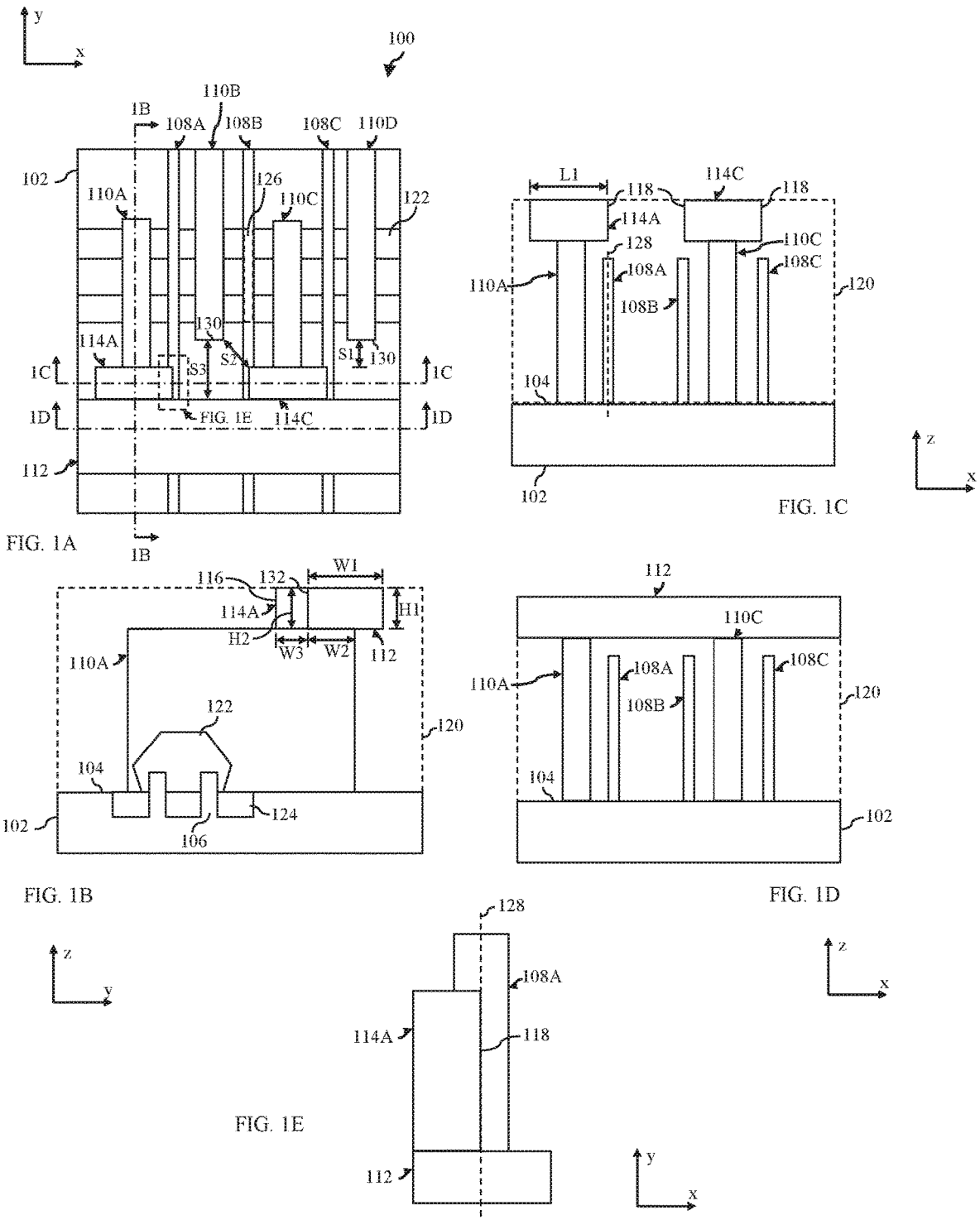

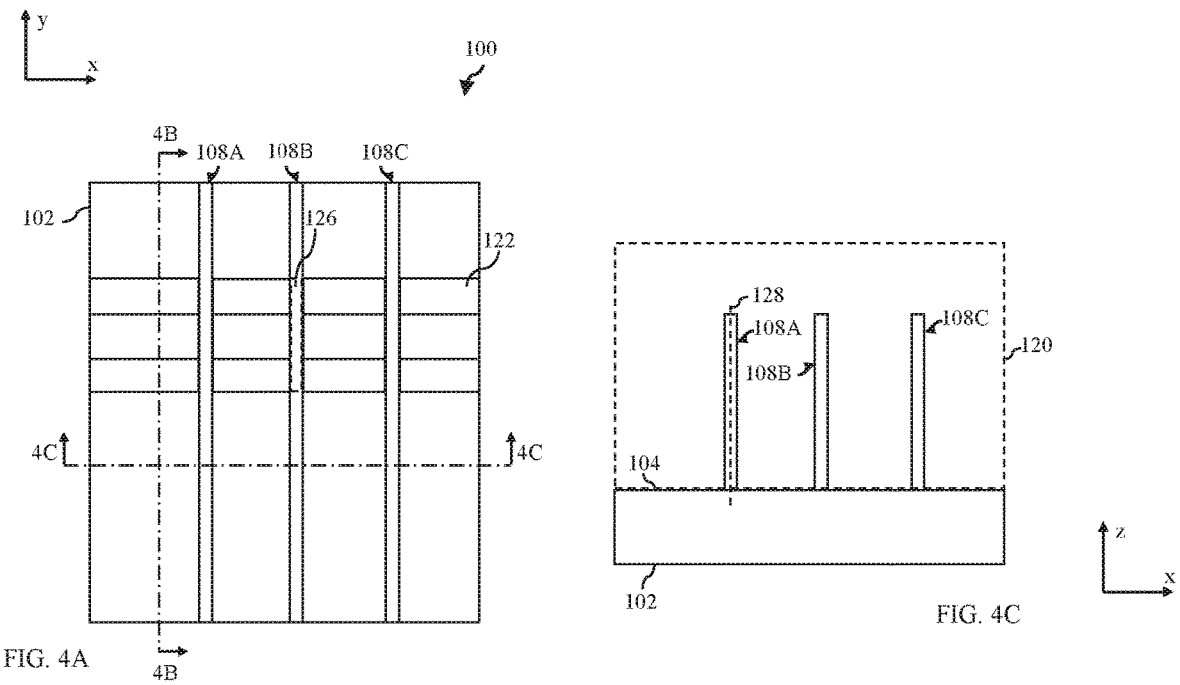
FIG. 4A
FIG. 4C
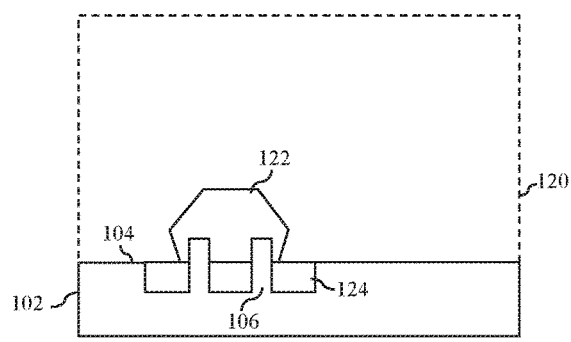
FIG. 4B

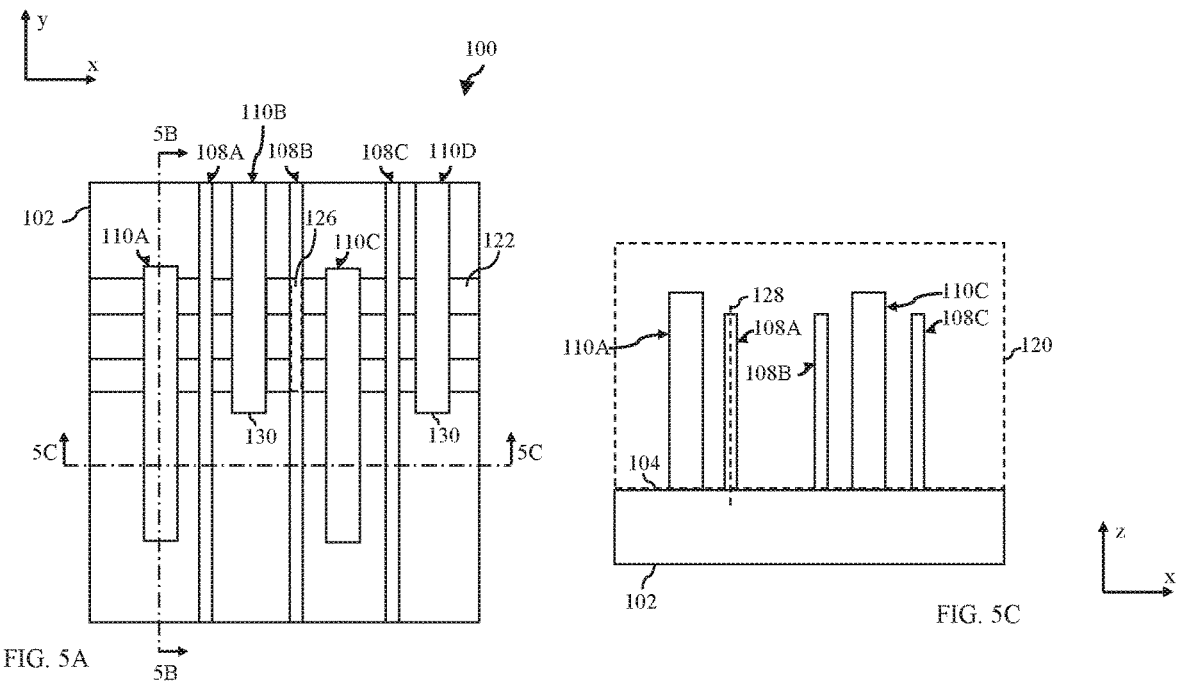
FIG. 5A
FIG. 5C
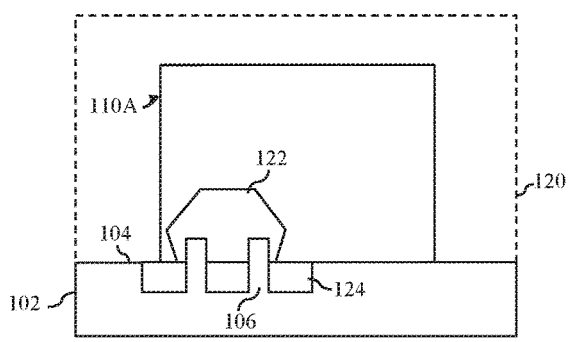
FIG. 5B

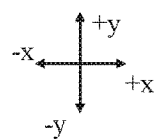
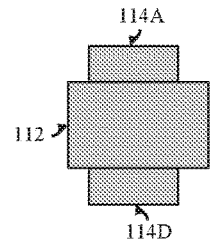
FIG. 6A
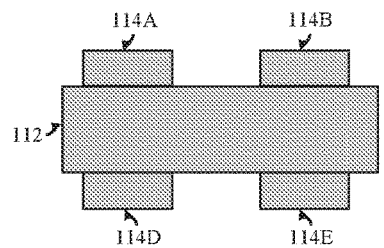
FIG. 6B
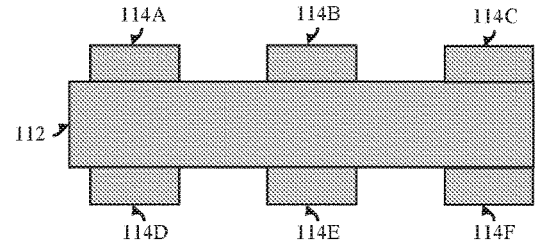
FIG. 6C
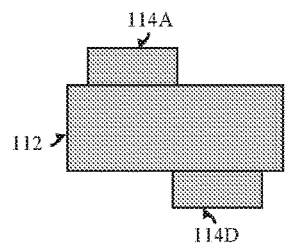
FIG. 6D
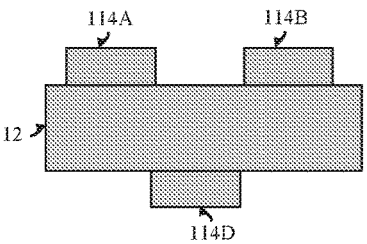
FIG. 6E
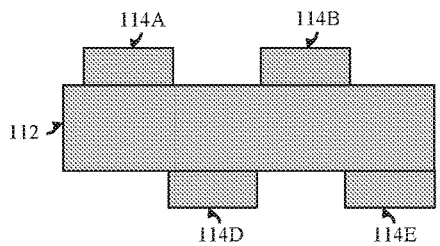
FIG. 6F
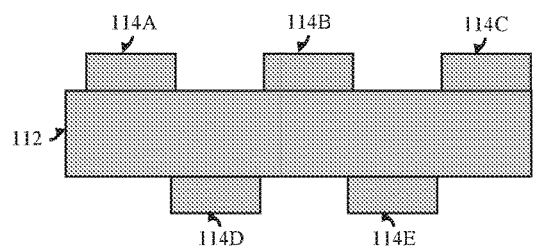
FIG. 6G
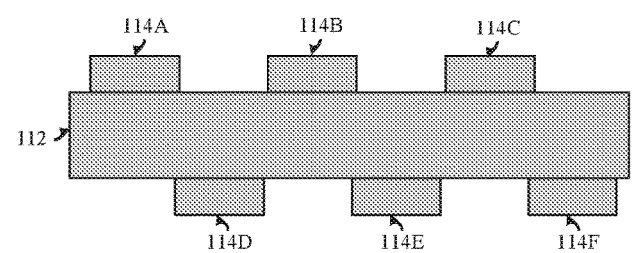
FIG. 6H

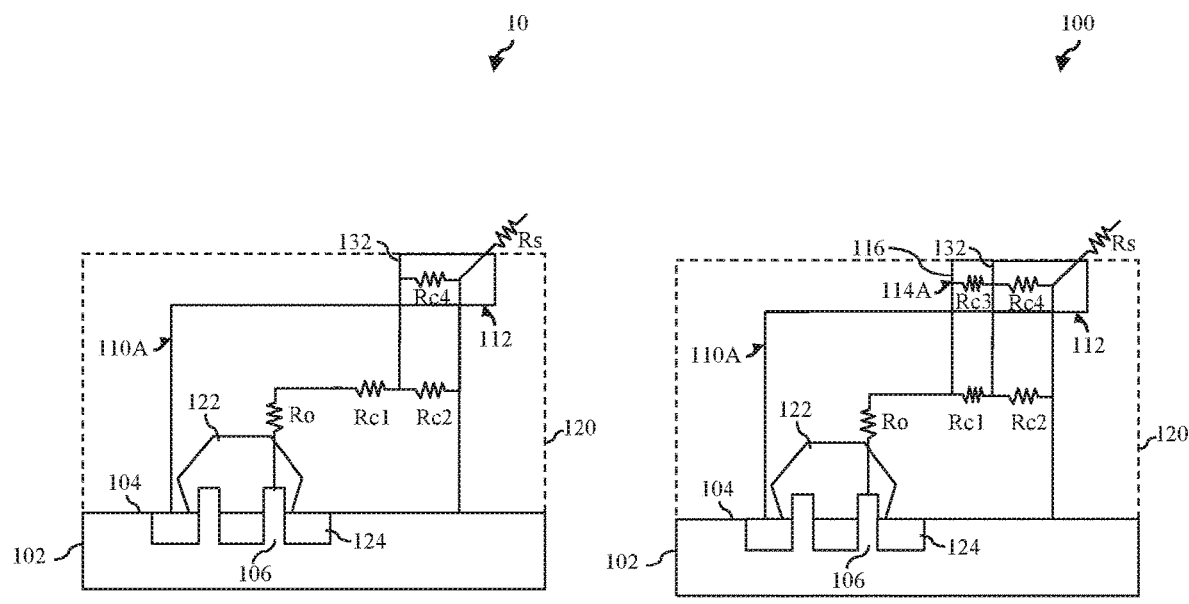
FIG. 7A
FIG. 7B

VIA RAIL STRUCTURE

PRIORITY DATA

This is a divisional application of U.S. Application No. 16,943,591, filed Jul. 30, 2020, which claims the benefit of U.S. Provisional Application No. 62/908,372, entitled "Via Rail Structure," filed Sep. 30, 2019, each of which is herein incorporated by reference in its entirety.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a top view of a semiconductor structure; FIG. 1B is a side section view of the semiconductor structure along line 1B, cut in the y-direction; FIGS. 1C and 1D are side section views of the semiconductor structure along lines 1C and 1D, respectively, cut in the x-direction; and FIG. 1E is a magnified top view of a portion of the semiconductor structure of FIG. 1A, constructed in accordance with some embodiments.

FIG. 4A is a top view of the semiconductor structure of FIG. 1A during fabrication; FIG. 4B is a side section view of the semiconductor structure along line 4B, cut in the y-direction; FIG. 4C is a side section view of the semiconductor structure along line 4C, cut in the x-direction, constructed in accordance with some embodiments.

FIG. 5A is a top view of the semiconductor structure of FIG. 1A during fabrication; FIG. 5B is a side section view of the semiconductor structure along line 5B, cut in the y-direction; FIG. 5C is a side section view of the semiconductor structure along line 5C, cut in the x-direction, constructed in accordance with some embodiments.

FIGS. 6A-6H are top views of via rails and respective jog vias, constructed in accordance with some embodiments.

FIG. 7A is a side section view of a semiconductor structure without a jog via, the semiconductor structure being cut in the y-direction and schematically illustrating current path and device resistance, in accordance with some embodiments; FIG. 7B is a side section view of a semiconductor structure having a jog via, the semiconductor structure being cut in the y-direction and schematically illustrating a parallel current path and device resistance, in accordance with some embodiments.

DETAILED DESCRIPTION

Figure 2A:
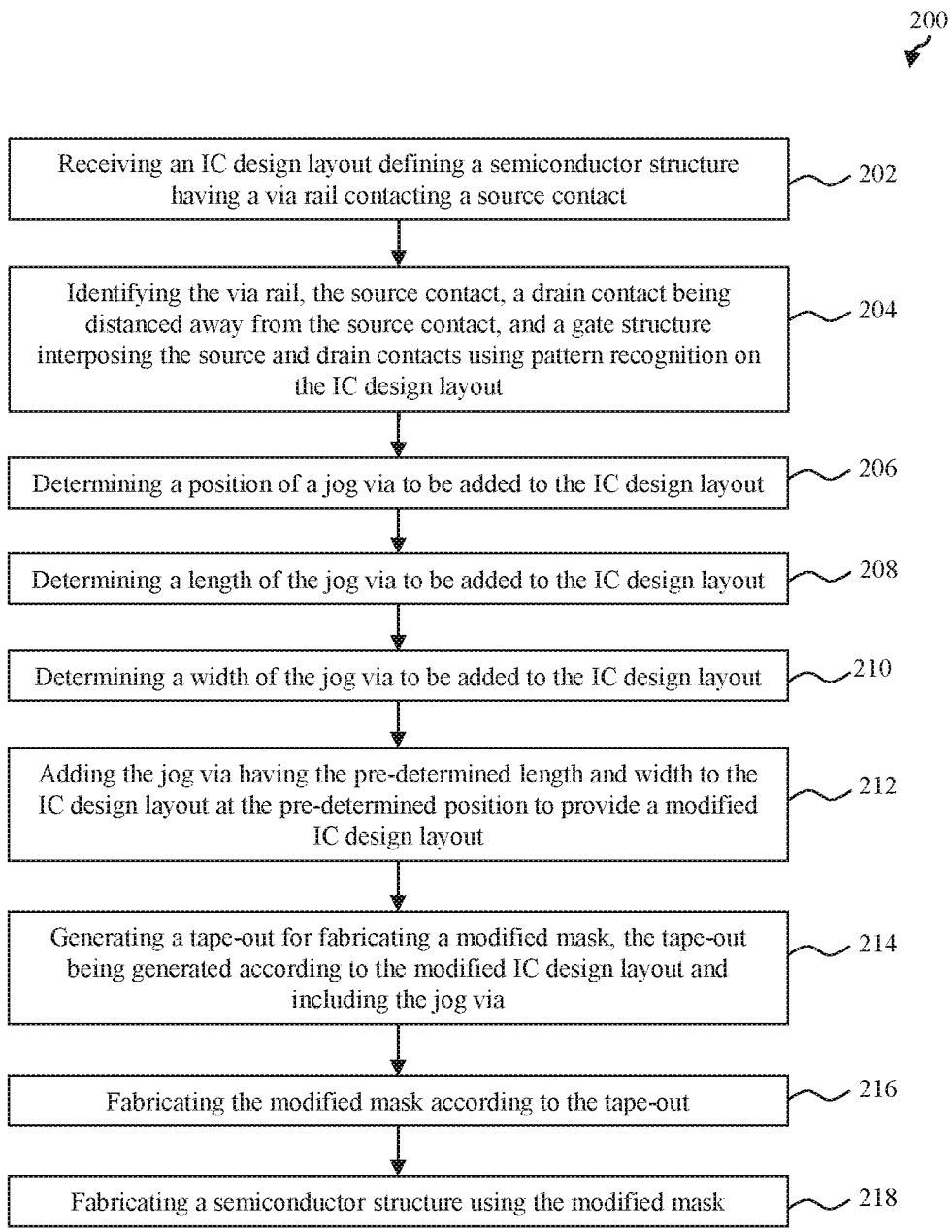
FIG. 2A is a flowchart of an integrated circuit fabrication method in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

During the down-scale process, conductive features often suffer increased resistance at interfaces due to the reduced contact areas. For example, a via rail (VDR) may be used to connect multiple source features to a power line. However, as the dimensions of the via rail and/or the source features shrink, the contact area shrinks which results in increased resistances. Therefore, this present disclosure provides a method of forming a VDR structure with reduced contact resistance without substantially increasing the footprint of the VDR structure on the semiconductor chip. In some implementations via extensions may be formed on functional metal at source side to selectively increase via contact area. Such structural improvement may boost device speed/performance without inducing via-metal leakage in the cell with highly packed metals.

According to one embodiment of the present disclosure, the VDR structure includes one or more jogs protruding from sidewalls of the rail. The jogs extend over and directly contact the source features, thereby providing increased contact area between the VDR and the source features. The jogs may be of any appropriate shapes. In some implementations, the shape of the jogs may be designed to match the shape of the source features. In some implementations, the shape of the jogs may be rectangular.

According to one embodiment of the present disclosure, the substrate may include an active region over the substrate extending along a first direction. The active region may include a plurality of source features and a plurality of drain features. A plurality of gate structures may be formed over the substrate and extending along a second direction substantially perpendicular to the first direction. The gate structures may each have a center line extending lengthwise along the second direction. A first plurality of metal lines may be formed to connect the source features to a via rail structure; and a second plurality of metal lines may be formed to be connected to the drain features and extending away from the via rail structure. Accordingly, the source features may be connected electronically to the via rail structure. The via rail structure may include a main portion and a plurality of jog portions. The main portion extends along the first direction in parallel to the active region. The jog portions protrude from the main portion towards the active region and directly contact the first plurality of metal lines. The size of the jog portions provides increased contact area with the source features, thereby reducing the contact resistance. The jog portions may extend along the first direction between the center lines of adjacent gate structures. The jog portions may have a width along the second direction such that they are spaced away from end surfaces of adjacent lines of the second plurality of metal lines along the second direction by at least 2 nm. A distance smaller than that may present leakage concerns.

Relying on jog portions to increase the contact area with the source features instead of increasing a width of the entire via rail can reduce contact resistance while avoiding detrimental effects of increasing pattern density, decreasing distance to metal drain contact, and increasing circuit area. In other words, avoiding increasing pattern density may be important because higher pattern density can be detrimental due to topography concern from subsequent processes, such as increased erosion and dishing effect during chemical mechanical polishing (CMP) processes. Avoiding decreasing distance to metal drain contact may be important because lower distance between via rail and metal drain contact can be detrimental due to current leakage and electrical shorting. Avoiding increasing circuit area may be important because increasing circuit area for fabricating the same device can increase cost.

The present disclosure is directed to, but not otherwise limited to, a field-effect transistor (FET) device. The FET device, for example, may be a complementary metal-oxide-semiconductor (CMOS) device including a P-type metal-oxide-semiconductor (PMOS) FET device and an N-type metal-oxide-semiconductor (NMOS) FET device. The FET may be two-dimensional (planar FET) or three-dimensional, such as a fin-type FET (FinFET). It will be appreciated that the present application should not be limited to a particular type of device, except as specifically claimed.

FIG. 1A is a top view of a semiconductor structure 100; FIG. 1B is a side section view of the semiconductor structure 100 along line 1B, cut in the y-direction; FIGS. 1C and 1D are side section views of the semiconductor structure 100 along lines 1C and 1D, respectively, cut in the x-direction; and FIG. 1E is a magnified top view of a portion of the semiconductor structure 100 of FIG. 1A, constructed in accordance with some embodiments.

The semiconductor structure 100 may include a semiconductor substrate 102 having a top surface 104. The semiconductor substrate 102 may include an active region, such as one or more fins 106. In some embodiments, the active region may include an oxide diffusion (OD) layer. In some embodiments, various devices, such as FETs as described above, may be formed on the fins 106 to form FinFETs. Each of the fins 106 may include an elongated shape, such as rectangular, extending lengthwise in a first direction (x-direction). In some implementations, the fins 106 may extend from the semiconductor substrate 102 being located at least partially below and above the top surface 104. The semiconductor substrate 102 may also include isolation features 124 disposed between and separating the fins 106. In some embodiments, the isolation features 124 may surround a bottom portion of the fins 106 and expose a top portion of the fins 106.

In some embodiments, the semiconductor substrate 102 includes silicon. In some other embodiments, the substrate 102 may include germanium, silicon germanium or other proper semiconductor materials. The substrate 102 may alternatively be made of some other suitable elementary semiconductor, such as diamond or germanium; a suitable compound semiconductor, such as silicon germanium, silicon carbide, gallium arsenic, indium arsenide, or indium phosphide; or a suitable alloy semiconductor, such as silicon germanium carbide, gallium arsenic phosphide, or gallium indium phosphide.

The semiconductor substrate 102 may also include various doped regions such as n-wells and p-wells. In some embodiments, the semiconductor substrate 102 may include a buried dielectric material layer for isolation formed by a proper technology, such as a technology referred to as separation by implanted oxygen (SIMOX).

The semiconductor substrate 102 may be uniform in composition or may include various layers. The layers may have similar or different compositions, and in various embodiments, some substrate layers have non-uniform compositions to induce device strain and thereby tune device performance. The semiconductor substrate 102 may include an epitaxial layer formed on the top surface, such as an epitaxial semiconductor layer overlying a bulk semiconductor wafer. In various embodiments, the semiconductor substrate 102 includes one or more epitaxially grown semiconductor material. For example, a silicon layer is epitaxially grown on a silicon wafer. In another example, a silicon germanium layer is epitaxially grown on a silicon wafer. In yet another example, silicon and silicon germanium are alternatively epitaxially grown on a silicon wafer. In some embodiments, suitable deposition processes for epitaxy growth include atomic layer deposition (ALD), chemical vapor deposition (CVD), high-density plasma CVD (HDP-CVD), physical vapor deposition (PVD) and/or other suitable deposition processes. Any of these techniques may be used to grow the semiconductor layer having any composition including a graded composition.

In some embodiments, the fins 106 may be formed with the semiconductor substrate 102 and may be identical to the semiconductor substrate 102. In some other embodiments, the fins 106 may be formed independently of the semiconductor substrate 102 and may have a different composition than the semiconductor substrate 102. In some embodiments, the fins 106 may be formed of a semiconductor material such as, for example, Si, Ge, SiC, SiGe, GeSn, SiGeSn, SiGeCSn, and/or other suitable semiconductor materials. In some embodiments, each fin 106 may include a stack of alternating layers collectively referred to as a multi-layer stack. In some embodiments, the fins 106 may be fabricated using photolithography and etch processes. The photolithography process may include forming a photoresist layer (resist) overlying the semiconductor substrate 102, exposing the resist to a pattern, performing post-exposure bake processes, and developing the resist to form a masking element (not shown) including the resist. The masking element may then be used for etching recesses into the semiconductor substrate 102, leaving the fins 106 on the semiconductor substrate 102. The etching process may include dry etching, wet etching, reactive ion etching (RIE), and/or other suitable processes. In some embodiments, the fins 106 may be grown using an epitaxy process. The epitaxy process may include chemical vapor deposition (CVD) techniques (for example, vapor-phase epitaxy (VPE), ultra-high vacuum CVD (UHV-CVD), low-pressure (LP-CVD), and/or plasma-enhanced CVD (PE-CVD)), molecular beam epitaxy, other suitable SEG processes, or combinations thereof.

In some embodiments, the isolation features 124 may include silicon oxide, silicon nitride, silicon oxynitride, other suitable isolation material (for example, including silicon, oxygen, nitrogen, carbon, or other suitable isolation constituent), or combinations thereof. The isolation features 124 can include different structures, such as shallow trench isolation (STI) structures, deep trench isolation (DTI) structures, and/or local oxidation of silicon (LOCOS) structures. In some implementations, STI features can be formed by etching a trench in the semiconductor substrate 102 (for example, by using a dry etch process and/or a wet etch process) and filling the trench with insulator material (for example, by using a chemical vapor deposition process or a spin-on glass process). A chemical mechanical polishing (CMP) process may be performed to remove excessive insulator material and/or planarize a top surface of the isolation features 124. In some implementations, STI features can be formed by depositing an insulator material over semiconductor substrate 102 after forming the fins 106 (in some implementations, such that the insulator material layer fills gaps (trenches) between adjacent fins 106) and etching back the insulator material layer to form the isolation features 124. In some implementations, the isolation features 124 may include a multi-layer structure that fills trenches, such as a bulk dielectric layer disposed over a liner dielectric layer, where the bulk dielectric layer and the liner dielectric layer include materials depending on design requirements (for example, a bulk dielectric layer that includes silicon nitride disposed over a liner dielectric layer that includes thermal oxide).

Various gate structures 108, such as gate structures 108A, 108B and 108C may be formed on the fins 106. Each fin 106 may include one or more channel regions 126 formed by a portion of the fin 106 underlying the gate structures 108 and interposed between each source and drain 122. Each of the gate structures 108A, 108B and 108C may include an elongated shape, such as rectangular, extending lengthwise in a second direction (y-direction) that is perpendicular to the first direction (x-direction). Each of the gate structures 108A, 108B and 108C may have a center line 128 along the second direction (y-direction). Each center line 128 may be spaced an equal distance in the first direction (x-direction) from sidewalls of the respective gate structure 108A, 108B and 108C. A vertical direction (z-direction) may be perpendicular to the top surface 104 of the semiconductor substrate 102, defined by the x-y plane. Various source/drain features 122 may be formed on the fins 106 and are configured with respective gate structures 108 to form FETs.

The source/drain features 122 may include both lightly doped drain (LDD) features and heavily doped drain (HDD) features. The raised source/drain features 122 may be formed by selective epitaxial growth for strain effect with enhanced carrier mobility and device performance. In some embodiments, the source/drain features 122 may be formed by one or more epitaxial (epi) processes, whereby Si features, SiGe features, SiC features, and/or other suitable features are grown in a crystalline state on the fins 106. Suitable epitaxial processes include CVD deposition techniques (e.g., vapor-phase epitaxy (VPE) and/or ultra-high vacuum CVD (UHV-CVD), molecular beam epitaxy, and/or other suitable processes. The epitaxial process may use gaseous and/or liquid precursors, which interact with the composition of the fins 106. In some embodiments, adjacent source/drain features 122 may be grown to merge together to provide increased contact area and reduce the contact resistance. This can be achieved by controlling the epitaxial growth process.

The source/drain features 122 may be in-situ doped during the epitaxial process by introducing doping species including: p-type dopants, such as boron or $BF_2$; n-type dopants, such as phosphorus or arsenic; and/or other suitable dopants including combinations thereof. If the source/drain features 122 are not in-situ doped, an implantation process is performed to introduce the corresponding dopant into the source/drain features 122. In an embodiment, the source/drain features 122 in an nFET include SiC or Si doped with phosphorous, while those in a pFET include Ge or SiGe doped with boron. In some other embodiments, the source/drain features 122 include more than one semiconductor material layers. For example, a silicon germanium layer is epitaxially grown on the fins 106 and a silicon layer is epitaxially grown on the silicon germanium layer. One or more annealing processes may be performed thereafter to activate the source/drain features 122. Suitable annealing processes include rapid thermal annealing (RTA), laser annealing processes, other suitable annealing technique or a combination thereof.

In some implementations, silicide layers may be formed on epitaxial source/drain features 122. In some implementations, silicide layers may be formed by depositing a metal layer over epitaxial source/drain features 122. The metal layer includes any material suitable for promoting silicide formation, such as nickel, platinum, palladium, vanadium, titanium, cobalt, tantalum, ytterbium, zirconium, other suitable metal, or combinations thereof. The semiconductor structure 100 is then heated (for example, subjected to an annealing process) to cause constituents of epitaxial source/drain features 122 (for example, silicon and/or germanium) to react with the metal. The silicide layers thus include metal and a constituent of epitaxial source/drain features 122 (for example, silicon and/or germanium). In some implementations, the silicide layers may include nickel silicide, titanium silicide, or cobalt silicide. Any un-reacted metal, such as remaining portions of the metal layer, is selectively removed by any suitable process, such as an etching process.

The source/drain features 122 may be disposed on both sides of the gate structures 108. The channel 126 may be underlying the corresponding gate structure 108 and is interposed between the corresponding source/drain features 122 with proper doping concentrations and doping profiles. For example, the channel 126 may be p-type doped (or n-type doped) while the corresponding source/drain features 122 may be n-type doped (or p-type doped). In one or more embodiments, the source/drain features 122 may be unaffected by dopant, such as Ge, in the channel 126. In some embodiments, the source/drain features 122 may be highly doped. The channel 126 may be formed through one or more steps to introduce suitable dopants, such as by ion implantation.

In some embodiments, the gate structures 108 may include high-k dielectric material and metal, therefore also referred to as high-k metal gate stacks. The gate structures 108 may include a gate dielectric layer and a gate electrode disposed on the gate dielectric layer. In some embodiments, the gate dielectric layer may include a high-k dielectric material and the gate electrode may include metal or metal alloy. In some examples, the gate dielectric layer and the gate electrode each may include a number of sub-layers. The high-k dielectric material may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials. The gate electrode may include Ti, Ag, Al, TiAlN, TaC, TaCN, TaSiN, Mn, Zr, TiN, TaN, Ru, Mo, Al, WN, Cu, W, Ru, Co, or any suitable conductive materials. In some embodiments, different metal materials may be used for nFET and pFET devices with respective work functions to enhance device performance.

In some implementations, the gate electrode may include multiple layers, such as one or more capping layers, work function layers, glue/barrier layers, and/or metal fill (or bulk) layers. A capping layer can include a material that prevents or eliminates diffusion and/or reaction of constituents between the gate dielectric and other layers of the gate electrode. In some implementations, the capping layer may include a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials may include TiN, TaN, Ru, Mo, Al, WN, $ZrSi_2$, $MoSi_2$, $TaSi_2$, $NiSi_2$, WN, other p-type work function material, or combinations thereof. N-type work function materials may include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as such as the work function layer and the metal fill layer. For example, the glue/barrier layer may include metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu.

The semiconductor structure 100 may further include conductive features (also referred to as conductive contact features) 110 formed on the semiconductor substrate 102 and landing on the source/drain features 122. In the present example, the conductive contact features 110 include exemplary conductive contact features 110A, 110B, 110C and 110D. The conductive contact features 110A, 110B, 110C and 110D may land on and directly contact respective source/drain features 122 on the fins 106. Each of the conductive contact features 110A, 110B, 110C and 110D may include an elongated shape, such as rectangular, extending lengthwise in the second direction (y-direction), being parallel to the gate structures 108A, 108B and 108C. In some implementations, a first plurality of the conductive contact features, such as source contacts 110A and 110C, may connect a plurality of source features 122 to a via rail 112, and a second plurality of the conductive contact features, such as drain contacts 110B and 110D, may connect to a plurality of drain features 122. Each drain contact 110B, 110D may include an end surface 130 facing the second direction (y-direction).

The semiconductor structure 100 may further include another conductive feature (referred to as a via rail) 112 disposed over the semiconductor substrate 102 and spaced from the fins 106. The via rail 112 may be formed over various conductive contact features 110. The via rail 112 may land on and directly contact the source contacts 110A, 110C without contacting the drain contacts 110B, 110D. The via rail 112 may be a power rail configured to provide power (such as a high power Vdd or a low power Vss) to the source/drain features 122 on the fins 106. The via rail 112 may include a main portion extending lengthwise in the first direction (x-direction). In some embodiments, the via rail 112 may have a width W1 in the second direction (y-direction) of approximately from about 10 nm to about 100 nm. In some embodiments, the via rail 112 may have a height H1 in the vertical direction (z-direction) of approximately from about nm to about 100 nm. In some embodiments, a portion of the via rail 112 contacting the first plurality may have a width W2 in the second direction (y-direction) of approximately from about nm to about 50 nm. In some embodiments, the via rail 112 may further include a vertical sidewall surface 132 facing the end surface 130 in the second direction (y-direction). In some embodiments, a ratio of a width of an MO layer along the second direction (y-direction) to the width W1 of the via rail 112 may be about equal to 1.6%.

The via rail 112 may further include other conductive features (referred to as jog vias) 114 formed on the sidewall surface 132 of the via rail 112. The jog vias 114 may protrude from the main portion of the via rail 112 in the second direction (y-direction) toward the fins 106. In some implementations, the jog vias 114 may contact the source contacts 110A, 110C. For example, the jog via 114A may land on and directly contact the source contact 110A, and the jog via 114C may land on and directly contact the source contact 110C. In some embodiments, the jog vias 114 may have a width W3 in the second direction (y-direction) of approximately from about 10 nm to about 50 nm. In some implementations, a ratio of the width W3 of each jog via 114 to the width W1 of the via rail 112 may be approximately 0.2. In some embodiments, the jog vias 114 may have a height H2 in the vertical direction (z-direction) of approximately from about 10 nm to about 100 nm and being about equal to the height H1 of the via rail 112. In some other embodiments, the height H2 may be greater or less than the height H1.

Each jog via 114A, 114C may further include a vertical sidewall surface 116 facing the end surface 130 in the second direction (y-direction). In some embodiments, a spacing S1 between the sidewall surface 116 and the end surface 130 of the drain contacts 110B, 110D may be about 2 nm or greater. In other words, a minimum spacing S1 along the second direction (y-direction) between the sidewall surface 116 and the end surface 130 may be equal to about 2 nm. A spacing S1 less than 2 nm may induce current leakage between the drain contacts 110B, 110D and the via rail 112. In some embodiments, the spacing S1 may be a critical design specification to prevent detrimental impact on device performance. In some embodiments, a spacing S2 may represent a nearest distance between each jog via 114A, 114C and an adjacent drain contact 110B, 110D. In some embodiments, a spacing S3 may represent a distance along the second direction (y-direction) between the via rail 112 and each drain contact 110B, 110D. In some embodiments, a minimum value for the spacing S1 may be set so that the spacing S2 is about equal to or greater than the spacing S3. In other words, the spacing S2 between each jog via 114A, 114C and a nearest drain contact 110B, 110D should not be less than the spacing S3 between the via rail 112 and each drain contact 110B, 110D. In other words, a minimum distance between the jog via 112 and each drain contact 110B, 110D should be greater than or about equal to a minimum distance between the end surface 130 and the sidewall surface 132. In this way, addition of the jog vias 114A, 114C will not increase current leakage or electrical shorting.

In some embodiments, the jog vias 114 may have a length L1 in the first direction (x-direction). In some embodiments, a ratio of the length L1 to a length of the via rail 112 along the first direction (x-direction) may be about 0.4% or less. This ratio may limit pattern density to effectively retain topography uniformity after CMP. Each jog via 114A, 114C may further include end surfaces 118 facing gate structures 108 in the first direction (x-direction). In some implementations, the end surfaces 118 may vertically align with the center line 128 of an adjacent gate structure 108. For example, the jog via 114A may have a first end surface 118 vertically aligned with the center line 128 of the gate structure 108A. Likewise, the jog via 114C may have a first end surface 118 vertically aligned with the center line 128 of the gate structure 108B and a second end surface 118 facing away from the first end surface 118 and vertically aligned with the center line 128 of the gate structure 108C. In the present disclosure, being aligned includes where an offset distance between an end surface 118 and the center line 128 is less than about 10% of a width of the gate structure 108. Forming the jog vias 114A, 114C to end at the center line 128 may balance a tradeoff between providing enough contact area to the source contacts 110A, 110C and providing enough spacing between the via rail 112 and the drain contacts 110B, 110D.

In some embodiments, the conductive contact features 110, the via rail 112, and the jog vias 114 may be formed of any suitable conductive material, such as Cu, Co, Ru, W, Mo, Ni, Cr, Jr, Pt, Rh, Ta, Ti, Al, TaN, TiN, compounds, or other suitable conductive materials. In some embodiments, the conductive contact features 110, the via rail 112, and the jog vias 114 may be deposited using PVD, CVD, ALD, electroplating, ELD, or other suitable deposition process, or combinations thereof.

The semiconductor structure 100 may further include an interlayer dielectric (ILD) layer 120. In FIGS. 1B-1D, the ILD layer 120 is illustrated with a dashed line so as to not obscure various embedded and/or underlying features discussed above. The ILD layer 120 may also be part of an electrical interconnect structure that electrically interconnects various devices of the semiconductor structure 100. In such embodiments, the ILD layer 120 may act as an insulator that supports and isolates the conductive traces. The ILD layer 120 may include any suitable dielectric material, such as a semiconductor oxide, a semiconductor nitride, a semiconductor oxynitride, other suitable dielectric materials, or combinations thereof. In some embodiments, the ILD layer 120 may include a low-k dielectric material (with a dielectric constant less than that of silicon oxide). The formation of the ILD layer 120 may include deposition and CMP to provide a planarized top surface.

The semiconductor structure 100 may further include additional interconnection structures, including various metal lines and via features. The metal lines and via features may couple the fins 106 into a functional circuit. Particularly, the interconnection structure may include one or more metal lines (not shown) contacting the via rail 112, the jog via 114A, the jog via 114B, or combinations thereof.

FIG. 2A is a flowchart of an integrated circuit fabrication method 200 in accordance with some embodiments. Referring collectively to FIGS. 1A, 1B, 1C, 1D, 1E and 2A, the method 200 begins at block 202 by receiving an IC design layout defining a semiconductor structure having a via rail 112 contacting a source contact 110A, 110C. In some implementations, the original IC design layout from the designer cannot meet the foregoing criteria for the jog vias 114A, 114C (such as position, size and spacing constraints). The following method provides a proper way to modify the IC design to meet the manufacturing rules. In some embodiments, the IC design layout may include multiple pattern layers. For example, the IC design layout may include a first pattern layer defining the fins 106; a second pattern layer defining the gate stacks 108; a third pattern layer defining the source contacts 110A, 110C and drain contacts 110B, 110D landing on respective source/drain features 122; and a fourth pattern layer defining the via rail 112. Additional pattern layers may be present in the IC design layout. For example, an interconnection structure, including various metal lines and via features in respective pattern layers, may be formed on the semiconductor substrate 102 and may be configured to couple various FETs into a functional circuit.

At block 204, the method 200 proceeds by identifying the via rail 112, the source contact 110A, 110C, a drain contact 110B, 110D being distanced away from the source contact 110A, 110C, and a gate structure 108 interposing the source and drain contacts 110. In some embodiments, the features may be identified using pattern recognition on the IC design layout. In some embodiments, the method 200 may include identifying an individual contact location between the via rail 112 and the source contact 110A, 110C using pattern recognition on the IC design layout.

Figure 2B:
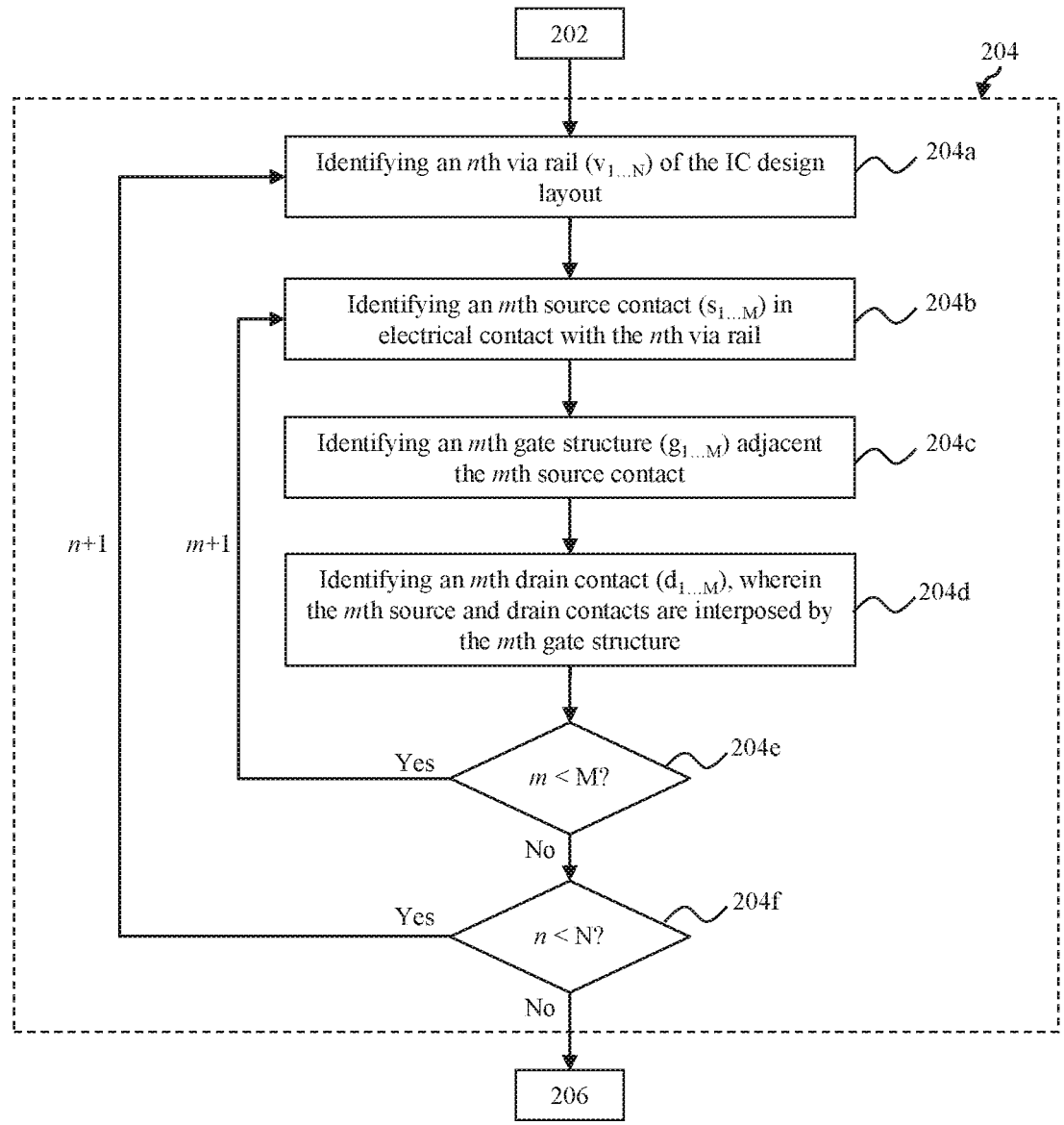
FIG. 2B is a flowchart illustrating various sub-steps of the method of FIG. 2A.

FIG. 2B is a flowchart illustrating various sub-steps of the method 200 of FIG. 2A. In particular, the various sub-steps may be implemented within block 204 of the method 200. Referring collectively to FIGS. 1A, 1B, 1C, 1D, 1E and 2B, the method 200 proceeds at block 204a by identifying an nth via rail ($v_{1...N}$) 112 of the IC design layout, where the value n ranges from 1 to N. At block 204b, the method 200 proceeds by identifying an mth source contact ($s_{1...M}$) 110A, 110C in electrical contact with the nth via rail 112. At block 204c, the method 200 proceeds by identifying an mth gate structure ($g_{1...M}$) 108 adjacent the mth source contact 110A, 110C. At block 204d, the method 200 proceeds by identifying an mth drain contact ($d_{1...M}$) 110B, 110D, wherein the mth source and drain contacts 110 are interposed by the mth gate structure 108. In the foregoing, the value of m ranges from 1 to M. At block 204e, the method 200 proceeds by determining whether m<M. If yes, then the method 200 returns to block 204b and increases the value m by 1. If no, then the method 200 proceeds to block 204f. At block 204f, the method 200 proceeds by determining whether n<N. If yes, then the method 200 returns to block 204a and increases the value n by 1. If no, then the method 200 proceeds to block 206 as shown in FIG. 2A. In the foregoing identifying steps at blocks 204a-d, the identifying may further include determining one of a position, size, and shape of each of the features.

Referring again to FIGS. 1A, 1B, 1C, 1D, 1E and 2A, at block 206, the method 200 proceeds by determining a position of a jog via 114A, 114C to be added to the IC design layout. In some embodiments, the position may be determined such that the end surface 118 of the jog via 114A, 114C facing the first direction (x-direction) is vertically aligned with the center line 128 of the gate structure 108. In some embodiments, the position may be determined according to an individual contact location. In some embodiments, the position may be a point on the sidewall surface 132 of the via rail 112 aligned along the second direction (y-direction) with each source contact 110A, 110C. In some embodiments, the position may be a point centered along the first direction (x-direction) between respective center lines 128 of adjacent gate structures 108. In some embodiments, the position may be represented by specifying a range along the first direction (x-direction) between respective center lines 128 of adjacent gate structures 108 instead of specifying a single point.

At block 208, the method 200 proceeds by determining a length L1 of the jog via 114A, 114C to be added to the IC design layout. In some embodiments, the length L1 may be determined such that the jog via 114A, 114C extends entirely across a width of the source contact 110A, 110C along the first direction (x-direction). In some embodiments, the length L1 may be determined so that first and second end surfaces 118 of the jog via 114A, 114C may be aligned with respective center lines 128 of the gate structure 108 and an adjacent gate structure 108. In some embodiments, the length L1 of the jog via 114A, 114C may be determined such that the second end surface 118 of the jog via 114A, 114C facing opposite the first end surface 118 is vertically aligned with a sidewall surface of the source contact 110A, 110C. In some embodiments, the length L1 of the jog via 114A, 114C may be determined such that the second end surface 118 of the jog via 114A, 114C facing opposite the first end surface 118 extends beyond the sidewall surface of the source contact 110A, 110C without extending to the center line 128 of the adjacent gate structure 108.

At block 210, the method 200 proceeds by determining a width W3 of the jog via 114A, 114C to be added to the IC design layout. In some embodiments, the width W3 may be determined such that a minimum distance between the jog via 114A, 114C and the drain contact 110B, 110D is greater than or about equal to a minimum distance between the end surface 130 of the drain contact 110B, 110D facing the second direction (y-direction) and the opposing sidewall surface 132 of the via rail 112. In other words, the width W3 may be determined so that the spacing S2 is greater than or about equal to the spacing S3. In some embodiments, the width W3 may be determined so that the spacing S1 is greater than or about equal to 2 nm. In some embodiments, a shape of the jog via 114A, 114C may include a rectangle, square, or other polygon.

At block 212, the method 200 proceeds by adding the jog via 114A, 114C having the pre-determined length L1 and width W3 to the IC design layout at the pre-determined position to provide a modified IC design layout. At block 214, the method 200 proceeds by generating a tape-out for fabricating a modified mask, the tape-out being generated according to the modified IC design layout and including the jog via 114A, 114C. The tape-out defines the modified IC design layout to be formed on photomasks for wafer fabrication or to be directly transferred to semiconductor wafers by direct writing techniques, such as electron-beam direct writing. The tape-out of the modified IC design includes various pattern layers (such as a layer of active regions, a layer of gate stacks and so on) and spatial relationships among those pattern layers, especially various shapes and sizes of various pattern features in each pattern layer. In some embodiments, the foregoing steps of the method 200 may be carried out using an electronic design automation (EDA) tool operable for generating, analyzing, and modifying IC design layouts.

At block 216, the method 200 proceeds by fabricating the modified mask according to the tape-out. At block 218, the method 200 proceeds by fabricating the semiconductor structure 100 using the modified mask.

Figure 3:
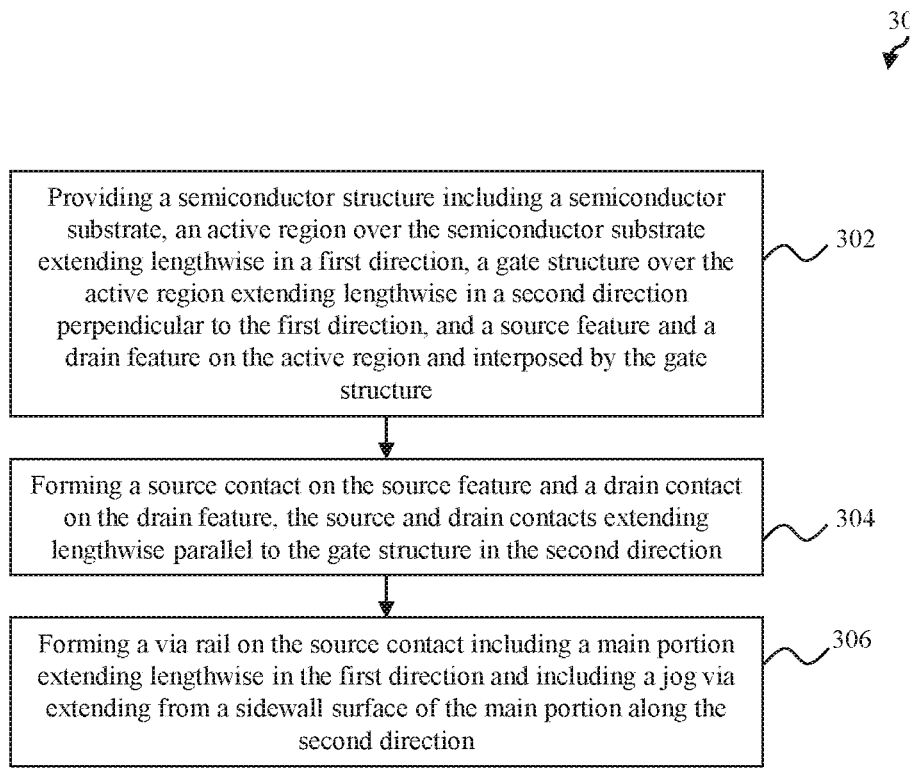
FIG. 3 is a flowchart of an integrated circuit fabrication method in accordance with some embodiments.

FIG. 3 is a flowchart of an integrated circuit fabrication method 300 in accordance with some embodiments. The fabrication method 300 may incorporate detailed description of like steps from FIGS. 2A and 2B without limitation. FIG. 4A is a top view of the semiconductor structure of FIG. 1A during fabrication; FIG. 4B is a side section view of the semiconductor structure along line 4B, cut in the y-direction; FIG. 4C is a side section view of the semiconductor structure along line 4C, cut in the x-direction, constructed in accordance with some embodiments. Referring collectively to FIGS. 3, 4A, 4B and 4C, the method 300 begins at block 302 by providing a semiconductor structure 100 including a semiconductor substrate 102, an active region over the semiconductor substrate 102 extending lengthwise in a first direction (x-direction), a gate structure 108 over the active region extending lengthwise in a second direction (y-direction) perpendicular to the first direction, and a source feature 122 and a drain feature 122 on the active region and interposed by the gate structure 108. In some embodiments, the active region may include fins 106. In some embodiments, the semiconductor structure 100 may include a plurality of gate structures 108A, 108B and 108C. In some embodiments, the semiconductor substrate 102 may include isolation regions 124 disposed therein. In some embodiments, an ILD layer 120 may be formed over the fins 106, the gate structures 108A, 108B and 108C, and the source/drain features 122. The semiconductor structure 100 at this stage in fabrication may incorporate detailed description of like structures from FIGS. 1A-1E without limitation.

FIG. 5A is a top view of the semiconductor structure of FIG. 1A during fabrication; FIG. 5B is a side section view of the semiconductor structure along line 5B, cut in the y-direction; FIG. 5C is a side section view of the semiconductor structure along line 5C, cut in the x-direction, constructed in accordance with some embodiments. Referring collectively to FIGS. 3, 5A, 5B and 5C, the method 300 proceeds to block 304 by forming a source contact 110A, 110C on the source feature 122 and a drain contact 110B, 110D on the drain feature 122, the source and drain contacts 110A, 110B, 110C, 110D extending lengthwise parallel to the gate structure 108 in the second direction (y-direction). The semiconductor structure 100 at this stage in fabrication may incorporate detailed description of like structures from FIGS. 1A-1E without limitation.

Referring again to FIGS. 1A, 1B, 1C, 1D, 1E together with FIG. 3, the method 300 proceeds to block 306 by forming a via rail 112 on the source contact 110A, 110C including a main portion extending lengthwise in the first direction (x-direction) and including a jog via 114A, 114C extending from the main portion along the second direction (y-direction). In some embodiments, the forming of the via rail includes forming the main portion and the jog via together. The semiconductor structure 100 at this stage in fabrication may incorporate detailed description of like structures from FIGS. 1A-1E without limitation.

FIGS. 6A-6H are top views of via rails 112 and respective jog vias 114 constructed in accordance with some embodiments. More particularly, FIGS. 6A-6C illustrate various embodiments where jog vias 114 on opposite sides (e.g., +y direction and −y direction) of via rail 112 are aligned in the second direction (y-direction), whereas FIGS. 6D-6H illustrate various embodiments where jog vias 114 on opposite sides of via rail 112 have a staggered arrangement. For example, in FIG. 6A, jog via 114A protrudes from via rail 112 in a +y direction and jog via 114D protrudes from via rail 112 in a −y direction. Additionally, jog vias 114A, 114D are aligned with each other along the y-direction being positioned at the same point along the x-axis. FIG. 6B illustrates a similar structure to FIG. 6A, however in this case, an additional pair of jog vias 114B, 114E are added. Specifically, jog vias 114B, 114E have a first spacing from jog vias 114A, 114D in the +x direction. FIG. 6C illustrates an embodiment having a third pair of jog vias 114C, 114F protruding from the via rail 112. In this case, jog vias 114C, 114F have a second spacing from jog vias 114B, 114E in the +x direction, where the first and second spacings are equal. Although only as many as three pairs of jog vias 114 are illustrated, it will be appreciated that four or more pairs of jog vias 114 could be included in the design.

Turning to FIG. 6D, much like FIG. 6A, jog via 114A protrudes from via rail 112 in the +y direction and jog via 114D protrudes from via rail 112 in the −y direction. However, in this case, jog via 114D is spaced from jog via 114A in the +x direction so that jog vias 114A, 114D have a staggered arrangement. FIG. 6E illustrates a similar structure to FIG. 6D, however in this case, an additional jog via 114B is added. Like the embodiment illustrated in FIG. 6B, jog via 114B is spaced from jog via 114A by the first spacing in the +x direction. Likewise, FIGS. 6F, 6G, and 6H each add one additional jog via 114 to the opposite side of via rail 112 from the previous jog via 114 including jog via 114E (−y direction), jog via 114C (+y direction), and jog via 114F (−y direction), respectively. Thus, FIG. 6H includes a total of six jog vias 114A-F. Although only as many as six jog vias 114 are illustrated, it will be appreciated that seven or more jog vias 114 could be included in the design.

FIG. 7A is a side section view of a semiconductor structure 10 without a jog via 114, the semiconductor structure 10 being cut in the y-direction and schematically illustrating current path and device resistance, in accordance with some embodiments; FIG. 7B is a side section view of a semiconductor structure 100 having a jog via 114, the semiconductor structure 100 being cut in the y-direction and schematically illustrating a parallel current path and device resistance, in accordance with some embodiments.

The semiconductor structure 10 includes a current path beginning from the fins 106 and including in series order, Ro, Rc1, Rc2 and Rc4 (in parallel), and Rs (sheet resistance). Thus, the semiconductor structure 10 has a total resistance value Rt1 from Ro to Rs, where Rt1=Rc1+1/(1/Rc2+1/Rc4). In contrast, the semiconductor structure 100 includes an additional parallel current path and larger via area such that the semiconductor structure 100 includes a current path beginning from the fins 106 and including in series order, Ro, Rc1 and Rc3 (in parallel), Rc2 and Rc4 (in parallel), and Rs. Thus, the semiconductor structure 100 has a total resistance value Rt2 from Ro to Rs, where Rt2=1/(1/Rc1+1/Rc3)+1/(1/Rc2+1/Rc4). Comparing current path and device resistance of the semiconductor structure 10 without the jog via 114 and the semiconductor structure 100 having the jog via 114, the semiconductor structure 100 having the additional parallel current path has lower device resistance, such that Rt2<Rt1. In some implementations, the semiconductor structure 100 may have increased device speed owing to the lower resistance.

The embodiments of the present disclosure offer advantages over existing art, though it is understood that other embodiments may offer different advantages, not all advantages are necessarily discussed herein, and that no particular advantage is required for all embodiments. By utilizing the disclosed method and structure, the jog vias 114A, 114C provide increased via contact area, reduced resistance, and increased device speed/performance.

The present disclosure provides a method for fabricating an integrated circuit (IC). The method includes receiving an IC design layout defining a semiconductor structure having a via rail extending lengthwise in a first direction and contacting a source contact extending lengthwise in a second direction perpendicular to the first direction. The method further includes identifying the via rail, the source contact, a drain contact being distanced away from the source contact, and a gate structure interposing the source and drain contacts using pattern recognition on the IC design layout. The method further includes determining a position, length, and width of a jog via to be added to the IC design layout. The method further includes adding the jog via having the pre-determined length and width to the IC design layout at the pre-determined position to provide a modified IC design layout and generating a tape-out for fabricating a modified mask.

The present disclosure provides a method for fabricating an integrated circuit (IC). The method includes providing a semiconductor structure including a semiconductor substrate, an active region over the semiconductor substrate extending lengthwise in a first direction, a gate structure over the active region extending lengthwise in a second direction perpendicular to the first direction, and a source feature and a drain feature on the active region and interposed by the gate structure; forming a source contact on the source feature and a drain contact on the drain feature, the source and drain contacts extending lengthwise parallel to the gate structure in the second direction; and forming, on the source contact, a via rail including a main portion extending lengthwise in the first direction and including a jog via extending from a sidewall surface of the main portion along the second direction, wherein a minimum distance between the jog via and the drain contact is greater than or about equal to a minimum distance between the sidewall surface of the main portion of the via rail and an opposing end surface of the drain contact.

The present disclosure provides a device. The device includes a semiconductor substrate; an active region over the semiconductor substrate extending lengthwise in a first direction; a gate structure over the active region extending lengthwise in a second direction perpendicular to the first direction; a source feature and a drain feature on the active region and interposed by the gate structure; a source contact on the source feature extending lengthwise parallel to the gate structure; a drain contact on the drain feature, the drain contact having an end surface facing the second direction; and a via rail over the substrate spaced from the active region. The via rail further includes a main portion extending lengthwise in the first direction, the main portion having a sidewall surface facing opposite the end surface of the drain contact; and a jog via extending from the main portion along the second direction and having a sidewall surface facing the second direction, each of the main portion and the jog via contacting the source contact, wherein a minimum distance between the jog via and the drain contact is greater than or about equal to a minimum distance between the end surface of the drain contact and the sidewall surface of the main portion of the via rail, and wherein the jog via includes an end surface facing the first direction and being vertically aligned with a center line of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a semiconductor substrate;
an active region over the semiconductor substrate extending lengthwise in a first direction;
a gate structure over the active region extending lengthwise in a second direction perpendicular to the first direction;
a source feature and a drain feature on the active region and interposed by the gate structure;
a source contact on the source feature extending lengthwise parallel to the gate structure;
a drain contact on the drain feature, the drain contact having an end surface facing the second direction; and
a via rail over the substrate spaced from the active region, the via rail including:
a main portion extending lengthwise in the first direction, the main portion having a sidewall surface facing opposite the end surface of the drain contact; and
a jog via extending from the main portion along the second direction and having a sidewall surface facing the second direction, each of the main portion and the jog via contacting the source contact, wherein a minimum distance between the jog via and the drain contact is greater than or about equal to a minimum distance between the end surface of the drain contact and the sidewall surface of the main portion of the via rail, and wherein the jog via includes an end surface facing the first direction and being vertically aligned with a center line of the gate structure.

2. The device of claim 1, wherein a minimum spacing along the second direction between the end surface of the drain contact and the sidewall surface of the jog via is equal to about 2 nm.

3. The device of claim 1, wherein the jog via extends entirely across a width of the source contact along the first direction.

4. The device of claim 1, wherein the jog via is a first jog via of a plurality of jog vias extending from the via rail, wherein the source contact is a first source contact of a plurality of source contacts, and wherein each jog via directly contacts a single source contact.

5. The device of claim 4, wherein a first resistance of the device including the plurality of jog vias is less than a second resistance of an equivalent device without the plurality of jog vias.

6. The device of claim 1, wherein the gate structure is a first gate structure, the device further includes a second gate structure and a third gate structure extending lengthwise in the second direction, wherein the second gate structure is disposed between the first and third gate structures, and
the main portion of the via rail is extending along the first direction from the first gate structure to the third gate structure.

7. The device of claim 3, wherein
the main portion of the via rail extends a first width W1 along the second direction,
the jog via extends a second width W2 along the second direction, and
the second width W2 is less than the first width W1.

8. The device of claim 7, wherein a ratio of W2 to W1 is approximately 0.2.

9. The device of claim 4, wherein
the sidewall surface of the main portion of the via rail is a first sidewall surface, the main portion has a second sidewall surface, and
the plurality of jog vias includes a first subset of the plurality of jog vias extending from the first sidewall surface and a second subset of the plurality of jog vias extending from the second sidewall surface.

10. The device of claim 9, wherein the first subset of the plurality of jog vias and the second subset of the plurality of jog vias are aligned, respectively, along the second direction.

11. The device of claim 9, wherein the first subset of the plurality of jog vias and the second subset of the plurality of jog vias are configured with a staggered arrangement.

12. The device of claim 1, wherein the active region is a first active region, wherein the source feature and drain feature are a first source feature and a first drain feature, the device includes a second active region over the semiconductor substrate extending lengthwise in the first direction, wherein
the gate structure is over the first and second active region,
a second source feature and a second drain feature on the second active region and interposed by the gate structure,
the first and second source features are merged together into a common source feature,
the source contact contacts the common source feature, and
the jog via is shifted away from the common source feature along the second direction.

13. A device comprising:
a semiconductor substrate;
a first and second active regions over the semiconductor substrate extending lengthwise in a first direction;
a gate structure over the active region extending lengthwise in a second direction perpendicular to the first direction;
a common source feature and a first drain feature on the first active region and interposed by the gate structure;
a second drain feature on the second active region, wherein the common source feature on the first active region, and wherein the common source feature and the second drain feature is interposed by the gate structure;
a source contact on the common source feature extending lengthwise parallel to the gate structure;
a drain contact on the first and second drain features, the drain contact having an end surface facing the second direction; and
a via rail over the substrate spaced from the active region, the via rail including:
a main portion extending lengthwise in the first direction, the main portion having a sidewall surface facing the end surface of the drain contact; and a first jog via extending from the main portion along the second direction and having a sidewall surface facing the second direction, each of the main portion and the first jog via contacting the source contact, wherein a minimum distance between the jog via and the drain contact is greater than a minimum distance between the end surface of the drain contact and the sidewall surface of the main portion of the via rail, and wherein the jog via includes an end surface facing the first direction and being vertically aligned with a center line of the gate structure.

14. The device of claim 13, wherein the jog via extends entirely across a width of the source contact along the first direction.

15. The device of claim 14, wherein
the main portion of the via rail extends a first width W1 along the second direction,
the jog via extends a second width W2 along the second direction, and
the second width W2 is less than the first width W1.

16. The device of claim 13, wherein
the sidewall surface of the main portion of the via rail is a first sidewall surface, the main portion has a second sidewall surface,
the first jog via is extending from the first sidewall surface,
the via rail includes a second jog via extending from the second sidewall surface, and
the first and second jog vias are aligned the second direction.

17. A device comprising:
a semiconductor substrate;
an active region over the semiconductor substrate extending lengthwise in a first direction;
a gate structure over the active region extending lengthwise in a second direction perpendicular to the first direction;
a source feature and a drain feature on the active region and interposed by the gate structure;
a source contact on the source feature extending lengthwise parallel to the gate structure;
a drain contact on the drain feature, the drain contact having an end surface facing the second direction; and
a via rail over the substrate spaced from the active region, the via rail including:
a main portion extending lengthwise in the first direction, the main portion having a sidewall surface facing the end surface of the drain contact; and
a jog via extending from the main portion along the second direction and having a sidewall surface facing the second direction, each of the main portion and the jog via contacting the source contact, wherein a minimum distance between the jog via and the drain contact is greater than or about equal to a minimum distance between the end surface of the drain contact and the sidewall surface of the main portion of the via rail, and wherein the jog via includes an end surface facing the first direction and being vertically aligned with a center line of the gate structure, wherein the jog via extends entirely across a width of the source contact along the first direction.

18. The device of claim 17, wherein the jog via is a first jog via of a plurality of jog vias extending from the via rail, wherein the source contact is a first source contact of a plurality of source contacts, and wherein each jog via directly contacts a single source contact, wherein
the sidewall surface of the main portion of the via rail is a first sidewall surface, the main portion has a second sidewall surface, and
the plurality of jog vias includes a first subset of the plurality of jog vias extending from the first sidewall surface and a second subset of the plurality of jog vias extending from the second sidewall surface.

19. The device of claim 18, wherein the first subset of the plurality of jog vias and the second subset of the plurality of jog vias are aligned along the second direction.

20. The device of claim 17, wherein
the main portion of the via rail extends a first width W1 along the second direction and extends a first height H1 along a third direction perpendicular to the first and second direction,
the jog via extends a second width W2 along the second direction and extends a second height H2 along the third direction,
the second width W2 is less than the first width W1, and
the second height H2 is greater than the first height H1.

* * * * *